US005623132A

United States Patent [19]

Gahm

[11] Patent Number: 5,623,132

[45] Date of Patent: Apr. 22, 1997

[54] MODULAR PORT TUNING KIT

[75] Inventor: Steve Gahm, Freeport, Ill.

[73] Assignee: Precision Sound Products, Inc., Freeport, Ill.

[21] Appl. No.: 516,800

[22] Filed: Aug. 18, 1995

[51] Int. Cl.[6] .................... H05K 5/00

[52] U.S. Cl. .................... 181/156

[58] Field of Search .................... 181/148, 152, 181/156, 199, 160; 381/159, 154

[56] References Cited

U.S. PATENT DOCUMENTS

| | | | |
|---|---|---|---|
| D. 359,958 | 7/1995 | Frodelius . | |
| 4,164,988 | 8/1979 | Virva . | |
| 4,201,274 | 5/1980 | Carlton . | |
| 4,213,515 | 7/1980 | Laupman | 181/156 X |
| 4,284,166 | 8/1981 | Gale | 181/156 |
| 4,549,631 | 10/1985 | Bose . | |
| 4,696,369 | 9/1987 | Dodrill . | |
| 4,928,788 | 5/1990 | Erickson . | |
| 5,117,938 | 6/1992 | Whanhaeng . | |
| 5,170,436 | 12/1992 | Powell . | |
| 5,286,928 | 2/1994 | Borland . | |
| 5,406,637 | 4/1995 | Gonzalez | 181/156 X |

OTHER PUBLICATIONS

Owner's Manual *"The Punch" Aeroport Tube*—Rockford Fosgate, May 1994.

*Primary Examiner*—Khanh Dang
*Attorney, Agent, or Firm*—Leydig, Voit & Mayer, Ltd

[57] ABSTRACT

A modular port turning kit for tuning a speaker enclosure. Two flared sections, a straight section, and a pair of cylindrical connectors are included in a kit. The straight section is cut to length to configure the port to have an enclosed volume of a size needed to tune a particular speaker enclosure. The straight section has a wall thickness and profile size which forms a butt junction with the junction end of the flared section. The connectors fit over the cylindrical peripheries to provide an interference fit when the sections are joined. The sections are all of thermoplastic material to provide sufficient rigidity. After testing, adhesive can be used to secure the butt junctions to form a permanent installation.

19 Claims, 4 Drawing Sheets

MODULAR PORT TUNING KIT

FIELD OF THE INVENTION

This invention relates to high quality sound systems, and more particularly to a modular port tuning kit for providing a tuned port for a speaker enclosure.

BACKGROUND OF THE INVENTION

It is well known that low frequency speakers, usually called woofers, must be specially enclosed to prevent the out-of-phase sound waves from the back of the speaker cone from destructively interfering with the sound waves generated at the front of the cone. Various reflex enclosures have been designed to accomplish that. In some cases, ports are engineered into the speaker enclosures, with the volume of the port designed to tune the volume of the speaker enclosure. A popular type of port is the straight cylindrical port, which is cut to length to achieve a given volume, and fixed in an aperture in the enclosure. A ported system is tuned to a particular resonance frequency, at which the mass of air in the port reacts with the volume of air in the cabinet to create resonance at that tuned frequency. A ported system exhibits improved sensitivity at the resonance frequency, thereby minimizing distortion not only at the tuned frequency, but in the band around that tuned frequency. The result is improved sensitivity at port resonance, and often an extension of the lower cutoff frequency of the loudspeaker.

A conventional cylindrical port can cause audible air turbulence, which is heard as a hissing or rushing sound. The turbulence is caused by the sharp discontinuity at the edges of the port where the port transitions into the volume of the room on one side, or the volume of the speaker enclosure on the other side. The very desirable feature of straight cylindrical ports, however, is that they can be easily tailored to the volume of the enclosure. It is a simple matter to calculate using available nomograms or available computer programs, the length of a port of given cross-sectional area needed to tune a speaker enclosure of particular enclosed volume, and then to simply cut the port to that length. The port is then rigidly affixed into the enclosure, and the job is completed.

In order to minimize air turbulence, it is preferable to utilize flared sections at the ends of the port. The flares avoid the sharp discontinuity of the straight cylindrical port, and thus minimize air turbulence. However, the flared port is non-uniform in cross-section, and it is no longer a simple matter to cut the port to length to tune it to a particular speaker enclosure.

Kits have become available utilizing plastic flared pieces and a central cardboard tube, with the practice being to cut the cardboard tube to a particular length, glue it to the flares, thereby to provide a tuned flared port of predetermined configuration. However, such kits have their own drawbacks.

First of all, using available nomograms or computer programs, and knowing the size of a speaker enclosure and the model of speaker within it, it is possible to determine the exact volume of air within the speaker enclosure. Having selected a frequency at which it is desired to tune the speaker enclosure, it is straightforward to determine the desired length of the port to within ⅛". However, using the plastic and cardboard pieces available heretofore, it is difficult to reliably cut and glue the pieces to achieve the accuracy which the calculation would tend to suggest is desirable. Thus, speaker enclosures might be tuned using the system, but would be tuned to somewhat different frequencies, depending on the actual lengths which can be achieved.

The inaccuracies are due in part to the cutting tolerances achievable with a non-rigid cardboard tube which might be on the order of 4" in diameter, as well as the inaccuracies which are achieved by gluing the tube to flared sections without sufficient fixturing to assure that every glued joint is identical.

The non-rigidity of the final assembly can also be a problem. In very large speaker systems, large masses of air are moved by the woofer, and a cardboard tube suspending a plastic flare has the possibility of mechanical failure over time.

It is also becoming more and more popular to provide high quality speaker systems in automobiles and vans. Those systems have not only the vibrational environment which comes from the speaker system, but also the increased shock and vibration attributable to the automotive application.

In summary, it can be seen that straight cylindrical ports achieve the benefit of simplicity, but do so at the expense of air turbulence. The prior art has attempted to deal with the air turbulence problem, but in doing so has created a system which is difficult to precisely size and also has problems with mechanical stability.

SUMMARY OF THE INVENTION

With the foregoing in view, it is a general aim of the present invention to provide a flared port kit for a high quality audio system which is about as simple to size as a cylindrical port installation, and which when assembled has superior mechanical integrity.

In accomplishing that aim, it is an object of the present invention to avoid the use of cardboard or other unstable materials, and to utilize plastic components interfit in a reliable and highly repeatable manner. An objective of the invention is to provide a tuning port which is compatible with a wide variety of applications, including large speaker installations and automotive installations.

It is a further object of the invention to provide such a ported system which can be assembled externally of the speaker enclosure, then inserted into the speaker enclosure through an aperture cut for the port, and attached to the speaker enclosure, all without the necessity of disassembling the speaker enclosure.

More particularly, a feature of the present invention is the provision of a modular port system which utilizes specialized flares or curves in combination with standardized straight sections, allowing the standardized components to be cut to length. After cutting, the sections are joined end-to-end at butt junctions which provide dimensional repeatability and mechanical stability. Cylindrical connectors are provided which fit both the specialized and standardized pieces, and in which the specialized pieces interact with the connectors to assure sufficient engagement in each joint (between a specialized and a standardized piece) to allow the device to be self-supporting by means of an interference fit.

Thus, it is a feature of the invention that the elements from a kit can be (after cutting the standardized piece to length) initially joined with an interference fit to allow insertion of the port into the speaker enclosure for trial. Subsequently, after testing, the port assembly can be withdrawn, disassembled, then joined by means of adhesive for a permanent installation.

Other objects and advantages will become apparent from the following detailed description when taken in conjunction with the drawings, in which:

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
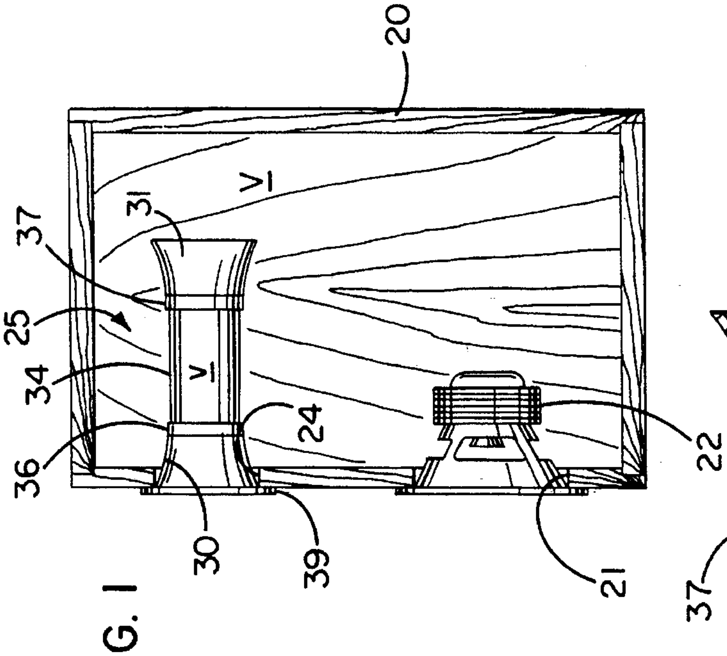
FIG. 1 is a cross-sectional view of a speaker enclosure showing a low frequency speaker and a modular tuning port, and illustrating the principles of the present invention.

Turning now to the drawings, FIG. 1 shows a typical speaker enclosure illustrating the use of the present invention. A speaker enclosure 20 is constructed as a sealed box having a first opening 21 for mounting a low frequency speaker or woofer 22. A second opening 24 is formed in the enclosure 20 and is adapted to receive a flared tuned port 25 constructed in accordance with the present invention. The enclosure 20 is otherwise sealed to enclose a volume of air identified as V. When using a nomogram or computer program, the volume V is represented by the interior dimensions of the enclosure 20 less the volume occupied by the woofer 22. The nomogram thereupon determines the volume v to be enclosed by the port 25, to tune the volume V at a given design frequency.

Figure 2:
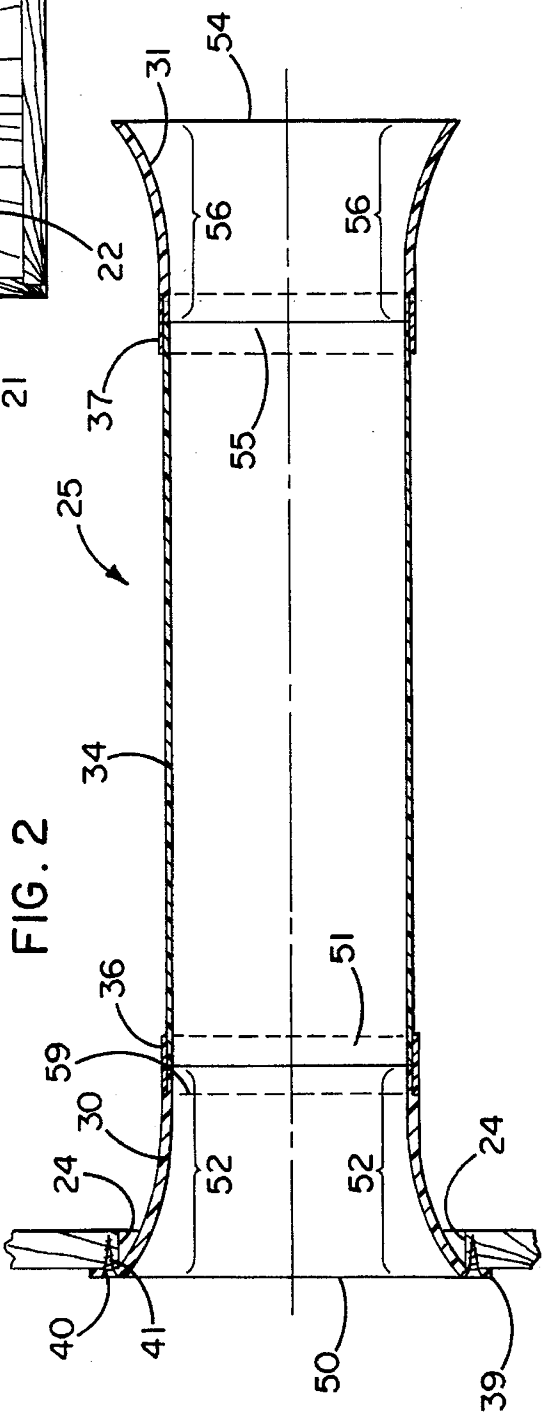
FIG. 2 is a diagram on an expanded scale with respect to FIG. 1, better illustrating the elements of the modular tuning port.
Figure 4:
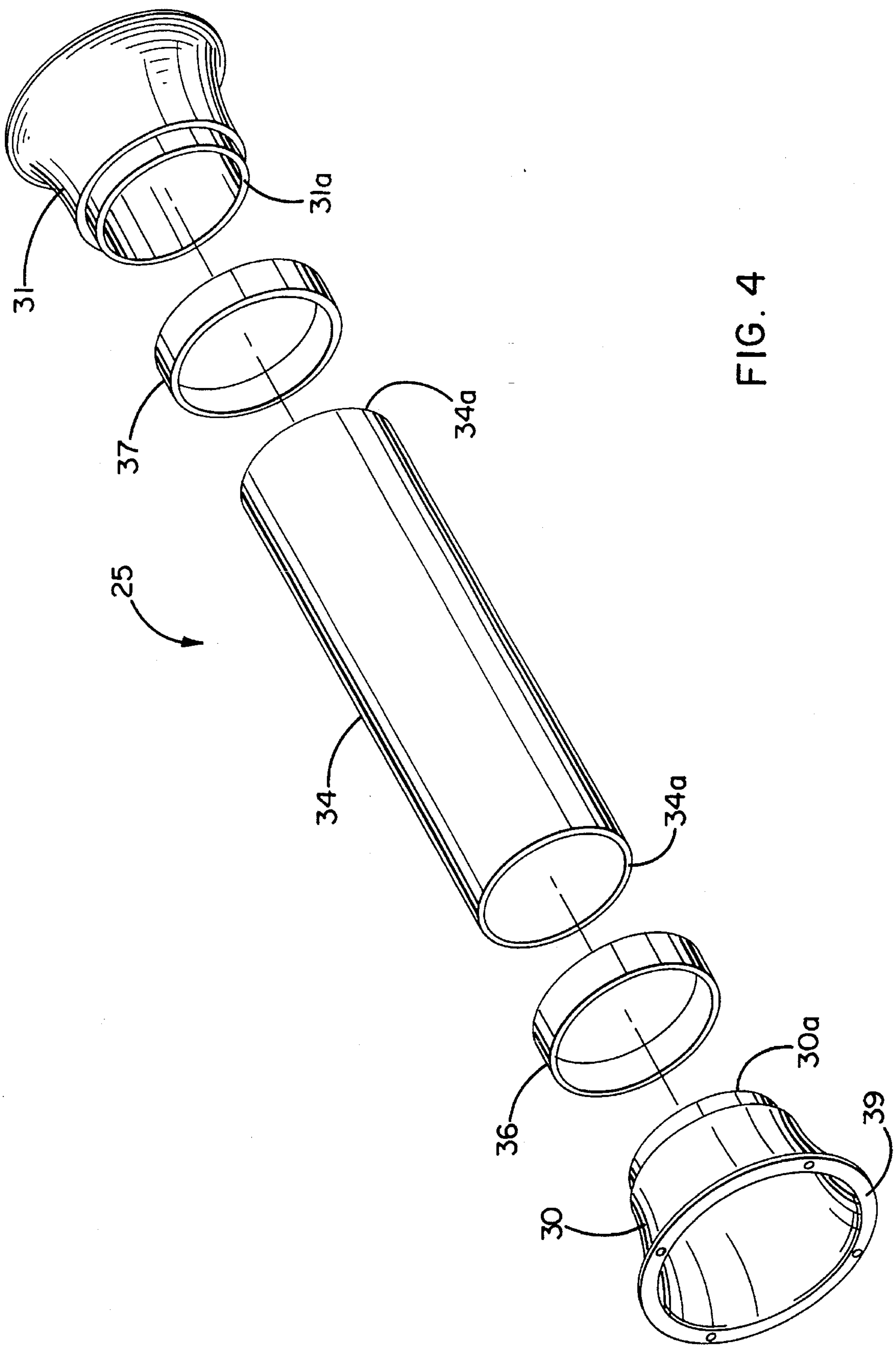
FIG. 4 is an exploded view illustrating the components of one form of modular port assembly constructed in accordance with the present invention.

As can be better seen in FIG. 4, the flared port 25 includes a first flared section 30, and a second flared section 31. Both said flared sections 30, 31 are specialized pieces having flared ends adapted to serve as input or output ends of the port, and joinder ends adapted to serve for connection to a standardized section. In the illustration of FIGS. 1, 2 and 4, the standardized section is a straight section 34 of uniform cylindrical cross section, adapted to be mated to joinder ends of the flares, 30, 31. In practicing the invention, connector rings 36, 37 are provided for joining the straight section 34 to the flares 30, 31 to provide a unitary tuned port assembly 25.

As noted above, a nomogram or computer program is typically utilized to determine the enclosed volume v to be provided by the tuned port 25. Prior calculations, or prior experiments, provide information on the enclosed volume of the flared sections 30, 31. The nomogram or program is then utilized to determine a length for straight section 34, having knowledge of its cross-sectional area, to yield a total volume v of the port (when assembled) to achieve the desired volume. The straight section 25 is then cut to length with reasonable accuracy, joined to the flares 30, 31 and the connector rings 36, 37 utilized to join the units to form a unitary assembly as illustrated in FIG. 1.

It is also worthy of note that the flared section 30 has a flange 39 with mounting holes 40 adapted to allow the port to be secured, as by screws 41, to the outside of the enclosure. It is preferred that the inside flare 31 be formed without such a flange, such that the largest diameter of the flare 31 is less than the outer diameter of the flange 39 on the flare 30. Thus, the unit can be assembled outside the enclosure, and simply slid into place, with the flange 39 being the first element of the tuned port which encounters the surface of the enclosure. In that environment, the flare 31 can be utilized as a template for drawing a circle on the enclosure which can then be cut, with the circle ultimately allowing the insertion of the flare 31 and the engagement of the periphery of the circle thus cut with the flange 39.

Referring in somewhat greater detail to FIG. 2, it will be seen that the flare 30 has a flared end 50 and a joinder end 51. A continuous flare 52 joins the ends, and is shaped to smoothly transition air moving between the exterior of the enclosure and the port along a smooth path which minimizes a possible air rushing sound. The second flare 31 is similarly shaped, except that preferably the second flare 31 has no mounting flange. The flare 31 has a flared end 54 and a straight end 55 joined by smoothly flared wall sections 56. The flares are injection molded thermoplastic sections of compatible material with the straight section 34. In the preferred embodiment, the thermoplastic material is ABS (acrylonitrile butadiene styrene). This material is chosen because of its useful physical properties, the ease of bonding the material, the availability of extruded straight parts, and the combination of an inexpensive material with an adequately rigid form.

The straight section 34 is also preferably of ABS, and is a uniform cylindrical piece, which is preferably extruded. It is intended that the kit be produced in three sizes. The nominal sizes which will satisfy most speaker requirements are 3", 4" and 5" inner diameter (measured at the straight section).

Figure 3:
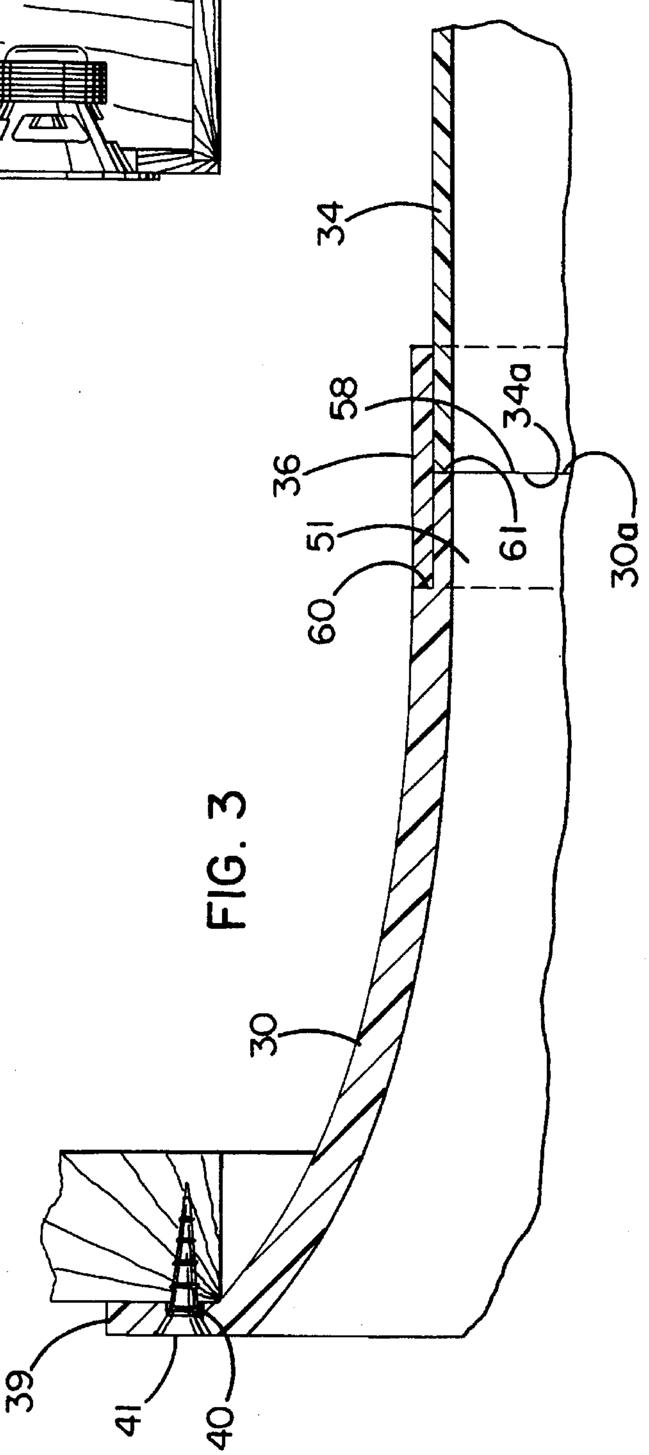
FIG. 3 is a further enlargement of the elements of FIG. 2 better showing a connecting ring joining a flared section butted to a straight section.

Referring concurrently to FIGS. 2 and 3, it will be seen that the junctions between the specialized sections 30, 31 and the standard section 34 are continuous smooth butt junctions which provide an inner surface which is substantially free of discontinuities. The junction is shown at 58 in FIG. 3, and it will be seen (see also FIG. 4) that the cylindrical outer surface **34*a* of the straight section 34 butts snugly against a cylindrical outer surface 30*a* of the joinder portion 51 of the flare section 30. The inner diameter of the straight section of the flare measured, for example, along the line 59 illustrated in FIG. 2, is the same as the inner diameter of the straight cylindrical section 34**. The wall thickness, preferably ⅛ to ¼ inches are also the same, and are thick enough to provide sufficient contact area to the butt junctions to render the device reliability self-supporting. The matched ID's provide a smooth continuous wall, so there are no discontinuities within the tube to cause air turbulence.

In accordance with an important aspect of the invention, connector rings are provided for joining the specialized and standardized sections in a way which insures the continuity of the joint and the repeatability of the dimension of the joint. Thus, connecting rings 36 are provided which are cylindrical sections, having inner diameters adapted for an interference fit with the outer diameter of the straight section 34 and a portion of the outer diameter of the joinder end 51 of the flare 30.

It will be seen from FIG. 3 that the joinder end 51 of the flare 30 has stop means in the form of a shoulder 60 formed in the outer wall thereof. The shoulder is spaced from the cylindrical surface 30*a*, the distance between those two elements is preferably set to be about one-half the width of a connector ring 56. Alternative, the proportions of the ring which overlie the respective joined sections can be other than 50/50 as long as sufficient contact length is provided to yield adequate support for the sections. Thus, in the preferred embodiment, the connector ring 36 is adapted to be approximately 1" in width, and the dimension between the shoulder 60 and the end 61 on the flare is approximately ½". The ring 36 is fit snugly over the outer diameter of the end 51 to butt against the shoulder 60. In that condition, the ring cannot slide farther onto the flare section, and approximately one-half the width of the ring is available to receive the outer periphery of the straight section 34. The straight section 34 will be fit into the connector ring without further forcing the ring onto the flare section. Furthermore, the substantial contact area of the butt junction 58 provides a perceptible stop, so that the user can exert sufficient force on the external section 34, fitting it within the connector ring 36, tapping the unit in place if necessary, until the butt junction 58 makes contact. At that point, force will be incapable of driving the units further together. And since the connector ring 36 is bottomed on the shoulder 60, it will be assured that there is an adequate engagement between the connector ring 36 and the straight section 34.

In the preferred embodiment, the wall thickness of the straight section 34 is approximately ⅛". The flare section has a wall thickness which is typically on the order of 5/16" or more, and the shoulder 60 thereby provides at least a 1/16" engagement with the connector 36 to resist overtravel of the connector ring. The butt junction 58 is formed around the entire periphery of say a 4" diameter tube, with a ⅛" wall dimension on each tube snugly butted end-to-end. The inner diameter of the connector ring 36 is about 0.01 inches greater than the outer diameter of the tube. For example, a 4" inner diameter tube would have an outer diameter of about 4.25" and would utilize a connector ring with an inner diameter of about 4.26" to provide a reliable interference fit, and the parts snugly fit within each other, such that the arrangement after assembly is rigid and self-supporting.

Thus, in using the relatively simple arrangement of FIG. 2, after the tube 34 is cut to the desired length, the two flares, the two connector rings, and the cut tube can then be assembled together with interference fits between the connector rings 36, 37 and the associated components, maintaining the butt junctions between the straight tube and the flare. The unit is self-supporting in that configuration, and can thus be inserted through the aperture in the enclosure, as shown in FIG. 1, to test the fit of the port. If everything proves to be acceptable, the unit can be withdrawn, and a conventional ABS adhesive applied at the ends of the flares, the ends of the straight section, and the internal periphery of the connectors 36, 37, following which the units are again assembled into a rigid finished assembly.

Even then, it is possible to alter the length of a tube thus assembled. For example, the tube can be cut anywhere along the straight section, and additional material added using additional connector rings and sections. Alternatively, the tube can be shortened by simply removing a portion of the straight section, then joining the remaining pieces using a further connecting ring.

FIG. 4 illustrates the components of a kit according to the invention in exploded form. It will be seen that the flares 30, 31 are identical except that only flare 30 has a mounting flange 39, whereas flare 31 is smaller in diameter by the width of the mounting flange. The straight section 34 is seen to be a thin walled cylinder, and thus is readily adaptable for cutting to length. As noted above, the computer program or nomogram would be modified to take account of the volume enclosed by the flares 30, 31, and the cross-sectional area of the tube 34, such that the result of the computation would be a determination of the length of the tube 34 which would be needed between butt joints with the flares to achieve the desired volume v within the port. Since the ABS tubing of four inches or so in diameter is clearly self-supporting, and since ABS is a material which can be worked with ordinary cutting tools, it is a rather straightforward matter to mark the needed length on the tube 34, then hold the tube in a vice or other sawing or cutting fixture, to make a straight axially perpendicular cut across the tube, thereby cutting the tube to the appropriate length.

The units can then be assembled in the order shown in FIG. 4, with the interference fit allowing the unit to be temporarily installed for testing. Indeed, the testing period can last for a period of time, if desired, due to the rather tight fit achieved by the rather large areas of surface contact between the connecting rings 36, the flares 30, 31 and the tube 34.

When it is desired to rendered the installation permanent, adhesive is applied as noted above, and the elements permanently affixed together. The flange 39 contacts the circular aperture 24 cut in the panel and screws, such as No. 6 drywall screws can be used to fasten the assembly to the speaker enclosure. If it is desired to use a threaded connection, threaded inserts can be attached to the rear of the panel (within the enclosure) at the mounting holes, and ordinary machine screws used to affix the flange to the enclosure.

Figure 5:
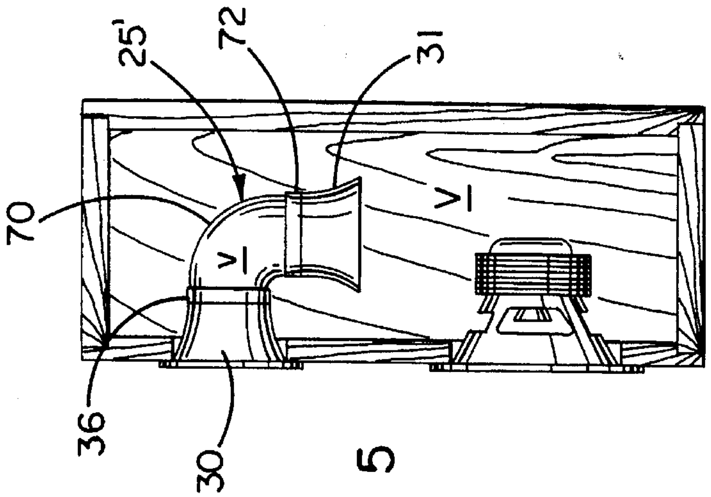
FIG. 5 is a diagram illustrating a modular port assembly utilizing a curved section.
Figure 6:
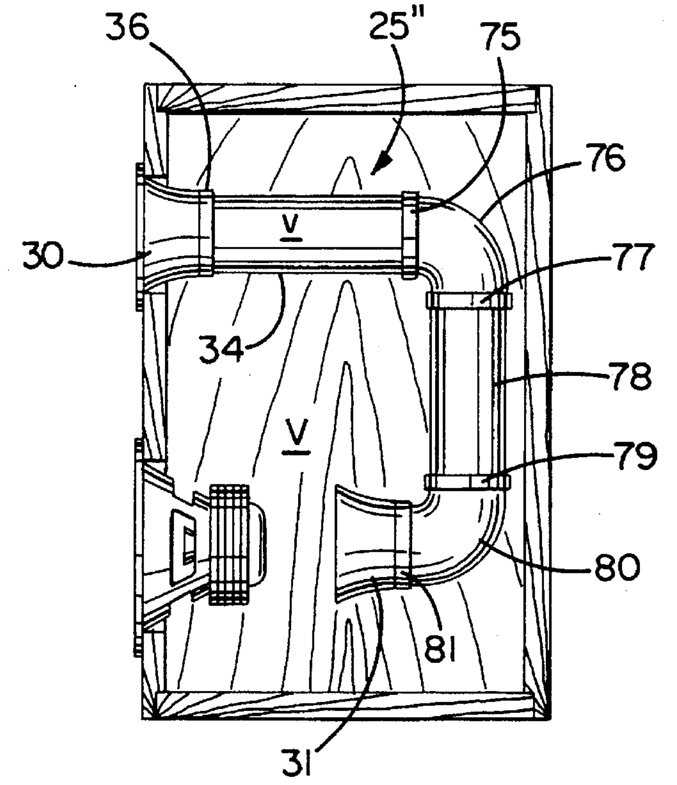
FIG. 6 illustrates another modular port assembly demonstrating a more complex arrangement.

FIGS. 5 and 6 show alternative embodiments of the invention using additional specialized sections, such as curved sections in the drawing shown as a right-angle elbow. Curved sections such elbows can be useful, for example, in a situation where the enclosure, due to obstructions or the like, cannot accommodate a single straight section of sufficient length. Thus, in FIG. 5, a modular port 25' is provided having an enclosed volume v tuned against a major volume V of the enclosure. In order to achieve the volume v within the port, a right-angle section 70 is used in the assembly. It is contemplated the curved sections such as 90° above or other curves will be provided as supplemental sections to be used with the standardized kit of FIG. 4 or FIG. 5. The section 70 is joined to an inlet flare 30 by means of a connector ring 36, and to a second internal flare 31. In the illustrated embodiment, the elbow 70 is connected directly to the flare 31 by means of a second connector 72. However, in the more typical implementation, a straight section will also be utilized either between the flare 30 and the elbow 70 or between the flare 31 and the elbow 70. The provision of the straight section allows the cutting to length of a standard piece to achieve a desired overall intended volume. The elbow 70 can be a molded ABS section, like the flares, or in order to reduce cost, can be a molded PVC section.

FIG. 6 shows yet another embodiment in which a pair of elbows are used to fold the port to achieve a very substantial internal volume v. It will be seen that the port 25" has an inlet flare 30 connected by connector 36 to a straight section 34 just as in the FIG. 1 embodiment. A further connector 75 connects the free end of the straight section to a right-angle elbow 76. A connector 77 then joins that assembly to a further straight section 78. The connector 79 joins that to a further elbow 80. Finally, a connector 81 joins the end of the elbow 80 to the internal flare 31. While the arrangement of FIG. 6 is made up of six sections and five connectors, due to the tightly fitting arrangement, the rigidity of the plastic, the ability to establish and glue butted junctions, the overall port configuration will be found to be reliable and capable of withstanding the vibration caused by the speaker, as well as shock and vibration when used in a vehicular application.

Figure 7:
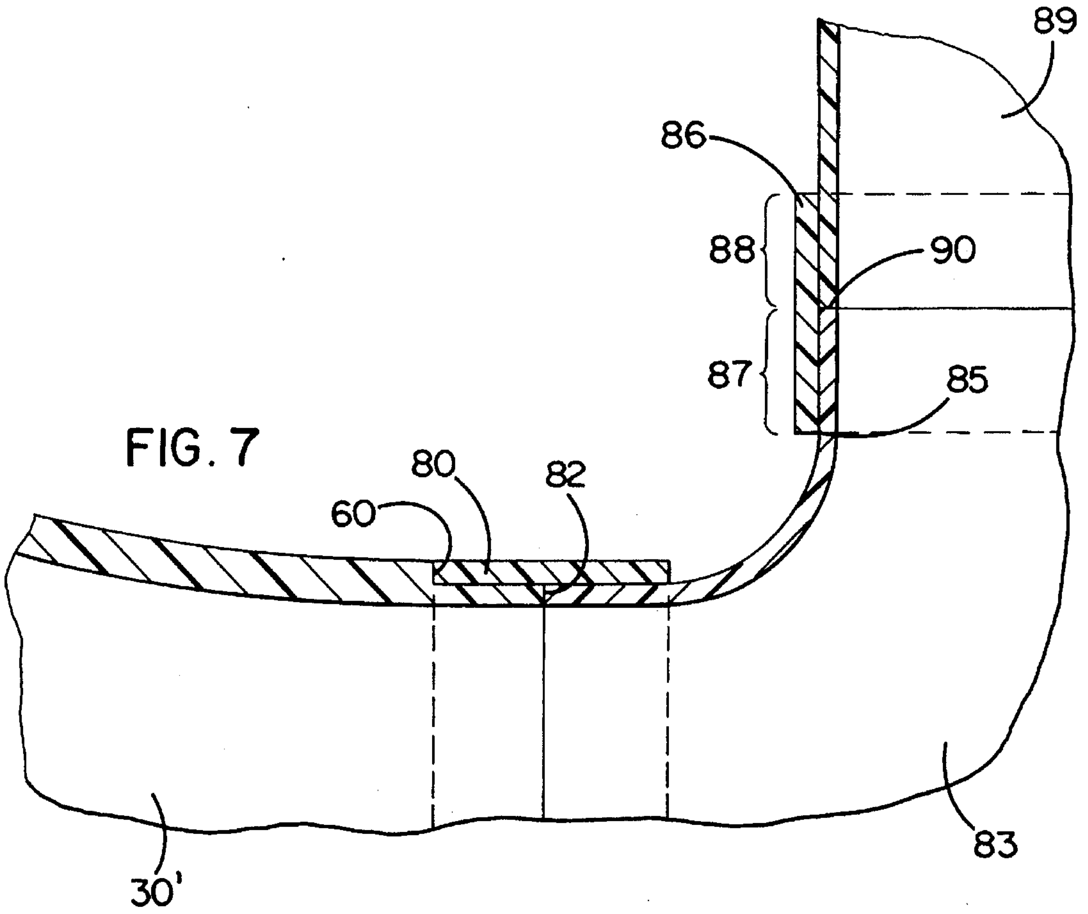
FIG. 7 illustrates connecting rings joining straight, curved and flared sections.

FIG. 7 illustrates the manner in which the connectors rings interact with the right-angle elbow pieces. It is recalled that the flare sections provided stop means in the form of a shoulder 60 to seat the connector ring in such a way that a free portion of the connector ring remained for insertion of the next section. The shoulder prevented the connector ring from being driven further onto the flare to assure that a significant length, preferably about half the connector ring was in frictional contact with the flare and the other half with the straight section.

The connector ring 80 of FIG. 7 illustrates the manner in which a shoulder 60 on a flare 30' seats the ring 80, to prevent further axial displacement of the ring as the next section is inserted. A butt junction 82 is then formed between the flare and the next section, and the ring 80 has approximately half its area covering the section 30' and the other half covering the adjacent section 83. The section 83 in the FIG. 7 embodiment is an elbow, and it will be seen that the curved portion of the elbow generally indicated at 85 provides a stop means function like the shoulder 60 of the flare. Thus, when the second connector 86 is slipped over the elbow 83, the curvature at the point 85 prevents the connector ring 86 from being forced further onto the elbow, serving as a function similar to the shoulder stop 60 of the flare. Thus, the ring 86 will be allowed to advance onto the elbow only to the extent that approximately half its width 87 is engaged with the elbow, and the other half 88 is available to receive the next section. The next section 89, in this case a straight section, is then inserted into the ring 86 to form a butt junction 90 with the elbow, and the stop 85 serving to prevent the ring from being advanced further onto the elbow, assuring that approximately half the ring 87 is available for contact with the elbow and the other half 88 available for contact with the next section with the subsequent straight section 89.

It will now be apparent that what has been achieved is an improved modular tuning port. By virtue of the materials employed and the constructional features including butt junctions, interference fits and connector rings, the resistance to vibration from the speaker as well as shock and vibration from an automotive application are readily resisted. The interference fit allows assembly for testing before committing to a permanent arrangement, and permanency is achieved by means of a simple adhesive, in the preferred embodiment, an ABS adhesive. The entire assembly can be installed in the speaker enclosure without the necessity for disassembling the speaker enclosure. It is only necessary to draw a circle on the speaker face at the appropriate point, preferably using the non-flanged flare 31 as a template, then cut a circular aperture for the flare. Holes can be drilled into the enclosure for the mounting screws, using the flange as a template. The volume is calculated, the straight piece standardized section cut to the appropriate length to adjust the volume. The assembly can be press fit together to try it out, and if the sound of the speaker enclosure is acceptable, the port can be withdrawn, permanently joined by adhesive, then permanently installed for a reliable and long-lasting installation.

What is claimed is:

1. A modular port tuning kit for tuning a speaker enclosure, the modular port after fitting and assembly having a given enclosed volume which is sized to tune the speaker enclosure, the port having flared ends for reducing air turbulence, the modular port tuning kit comprising, in combination:

two flared sections molded of thermoplastic material each having a flared end and a joinder end, the joinder end terminating in a continuous cylindrical surface of sufficient thickness to form a butt junction with a juxtaposed second section, stop means near the joinder end and located a predetermined distance from the cylindrical surface, a mounting flange on the flared end of one of the flared sections for attaching the port to a speaker enclosure;

a straight thermoplastic section comprising a cylinder of thin uniform wall thickness which is substantially the same as the wall thickness of the joinder end at said cylindrical surface, such that the straight section can be juxtaposed to the joinder end of a flared section to form a butt junction;

cylindrical connectors of thermoplastic material compatible with said sections for joining said sections, each cylindrical connector having an inner diameter of a size which produces an interference fit on the outer diameter of the straight section and the joinder end of the flared sections, each cylindrical connector having an axial length which is sufficiently greater than said predetermined distance to cause the cylindrical connector to cooperate with the stop means on a flared section upon insertion of a straight section to form a butt junction supported by the cylindrical connector; and an interference fit being achieved by the relative size of the inside of the collar and outside of the sections which is adequate to allow hand assembly of the components for fitting and testing, and subsequent adhesive connection for a permanent installation.

2. A modular port tuning kit as defined in claim 1 wherein the axial length of the cylindrical connector is about twice said predetermined distance.

3. The modular port tuning kit as defined in claim 1 wherein the straight section is an extruded section.

4. The modular port tuning kit as defined in claim 1 further including a curved section of molded thermoplastic material having joinder ends at each end, each joinder end in the right-angle section terminating in a continuous cylindrical surface of sufficient thickness to form a butt junction with a juxtaposed second section, and stop means near the joinder end and located a predetermined distance from the cylindrical surface.

5. The modular port tuning kit as defined in claim 3 wherein the thermoplastic material is rigid ABS.

6. The modular port tuning kit as defined in claim 5 including an ABS adhesive for securely joining the connectors and joined sections to maintain said butt junction.

7. The modular port tuning kit as defined in claim 3 wherein the wall thickness of the straight section is about ⅛ inch.

8. The modular port tuning kit as defined in claim 3 wherein the cylindrical connector has an axial length which is about one inch, and the predetermined distance between the stop means and the cylindrical surface is about ½ inch, so that about ½ inch of each section of a pair of joined sections is supported by an interference fit.

9. The modular port tuning kit as defined in claim 1 wherein only said one flared section has a mounting flange, the other flared section being free of a mounting flange and having a smaller outer diameter than the outer diameter of the flange.

10. A modular port tuning kit for a speaker enclosure, adapted to be assembled to form a port having flared ends for reducing air turbulence and being configured as a kit to allow adjustment of the volume of the port from flared end to flared end to tune the port to the volume of the speaker enclosure, the modular port tuning kit comprising, in combination:

two flared sections of molded thermoplastic material each having a flared end and a joinder end, the joinder end terminating in a continuous cylindrical surface of sufficient thickness and rigidity to form a butt junction with a juxtaposed straight section, a stop on the outer periphery of the joinder end, a mounting flange at the flared end of one of the flared sections for attaching the tuning kit to a speaker enclosure;

a straight cylindrical section of thermoplastic material having an inside periphery sized to match the inside periphery of the joinder end of the flared section, the straight section being adapted for cutting to length to adjust the enclosed volume of the port, the cut length presenting substantially uniform inner and outer diameters independently of the length of the section after cutting to allow any cut section of the straight section to be assembled to the flared sections;

connecting collars of thermoplastic material compatible with said section and sized to fit snugly over the outer diameter of the straight section and over the outer diameter of the joinder end of the flared section, to engage against the stop of the flared section leaving a portion of the inside of the collar available to snugly receive the straight section; and the engagement between the connecting collars and the sections being an interference fit adequate to hold the sections assembled for fitting and testing of the port after cutting to length without the need for gluing of the sections during a test phase of assembly.

11. The modular tuning kit adaptor as defined in claim 10 wherein the straight section is an extruded section of thermoplastic material.

12. The modular port tuning kit as defined in claim 10 further including a curved section of molded thermoplastic material having a joinder end at each end, each joinder end in the right-angle section terminating in a continuous cylindrical surface of sufficient thickness to form a butt junction with a juxtaposed second section, and stop means near the joinder end and located a predetermined distance from the cylindrical surface.

13. The modular port tuning kit as defined in claim 11 wherein the thermoplastic material is rigid ABS.

14. The modular port tuning kit as defined in claim 13 including an ABS adhesive for securely joining the connecting collars and joined sections to maintain said butt junction.

15. The modular port tuning kit as defined in claim 11 wherein the wall thickness of the straight section is about ⅛ inch.

16. The modular port tuning kit as defined in claim 11 wherein the connecting collars each have an axial length which is about one inch, and the predetermined distance between the stop means and the cylindrical surface is about ½ inch, so that about ½ inch of each section of a pair of joined sections is supported by an interference fit.

17. The modular port tuning kit as defined in claim 10 wherein only said one flared section has a mounting flange, the other flared section being free of a mounting flange and having a smaller outer diameter than the outer diameter of the flange.

18. A tuning port for a speaker enclosure comprising in combination:

a first flared section having a first end with a mounting flange and a second joinder end terminating in a continuous cylindrical surface of sufficient thickness to form a butt junction with a juxtaposed second section, a straight section comprising a cylinder of thin uniformed wall thickness which is substantially the same as the wall thickness of the joinder end at said cylindrical surface to form a butt junction therewith, a cylindrical connector of limited axial length overlying and supporting the butt junction between the straight section and flared section, a second flared section identical to the first except that the second flared section has no mounting flange, a second cylindrical connector overlying and supporting the butt junction between the second flared section and the straight section, all of said sections and cylindrical connectors being of thermoplastic material having sufficient wall thickness to be self-supporting.

19. The tuning port of claim 18 further including adhesive joining the connectors to the sections for maintaining the continuity of the butt junctions between said sections.

* * * * *